United States Patent
Chao et al.

(10) Patent No.: US 9,268,421 B2
(45) Date of Patent: Feb. 23, 2016

(54) TOUCH PANEL AND METHOD FOR FABRICATING THE SAME AND DISPLAY DEVICE COMPRISING THE SAME

(75) Inventors: Chieh-Yu Chao, Miao-Li County (TW); Canone Chen, Miao-Li County (TW); Jia-Ming Hsieh, Miao-Li County (TW); Wei-Lun Liao, Miao-Li County (TW)

(73) Assignees: INNOCOM TECHNOLOGY (SHENZHEN) CO., LTD., Longhua Town, Shenzhen (CN); INNOLUX CORPORATION, Miao-Li County (TW)

( * ) Notice: Subject to any disclaimer, the term of this patent is extended or adjusted under 35 U.S.C. 154(b) by 587 days.

(21) Appl. No.: 13/572,041

(22) Filed: Aug. 10, 2012

(65) Prior Publication Data

US 2013/0044077 A1 Feb. 21, 2013

(30) Foreign Application Priority Data

Aug. 17, 2011 (TW) .............................. 100129321 A

(51) Int. Cl.
*G06F 3/041* (2006.01)

(52) U.S. Cl.
CPC ...... *G06F 3/041* (2013.01); *G06F 2203/04103* (2013.01)

(58) Field of Classification Search
CPC .......... G06F 3/044; G06F 2203/04103; G06F 3/041; G06F 3/0412; G06F 3/03547; B32B 37/12; B32B 2307/412; B32B 2457/208; Y10T 156/1052; H03K 17/955; H03K 17/962; H03K 17/9622

See application file for complete search history.

(56) References Cited

U.S. PATENT DOCUMENTS

| | | | |
|---|---|---|---|
| 2002/0052057 A1* | 5/2002 | Wong | 438/30 |
| 2010/0323166 A1* | 12/2010 | Chang et al. | 428/172 |

(Continued)

FOREIGN PATENT DOCUMENTS

| | | |
|---|---|---|
| CN | 102129335 | 7/2011 |
| TW | 201113582 | 4/2011 |
| TW | 201128254 | 8/2011 |

OTHER PUBLICATIONS

Chinese language office action Feb. 4, 2015, issued in Application No. 201110245342.6.

(Continued)

*Primary Examiner* — Abbas Abdulselam
*Assistant Examiner* — Gerald Oliver
(74) *Attorney, Agent, or Firm* — McClure, Qualey & Rodack, LLP

(57) ABSTRACT

The disclosure provides a touch panel, including: a substrate, wherein the substrate includes a viewing region and a border region at an edge of the viewing region; a patterned transparent conductive layer formed on the substrate, wherein the patterned transparent conductive layer formed on the viewing region has a touch sensitive function; and a patterned metal layer formed on the patterned transparent conductive layer and on the border region, wherein the patterned metal layer includes a contact region and a trace region connecting to the contact region, and at least a portion of the contact region overlaps with the patterned transparent conductive layer, and a shift range between a formation position of the contact region of the patterned metal layer and a formation position of the patterned transparent conductive layer is smaller than about 150 μm.

15 Claims, 5 Drawing Sheets

(56) References Cited

U.S. PATENT DOCUMENTS

2011/0005662 A1* 1/2011 Sung .............................. 156/153
2011/0148780 A1 6/2011 Lu et al.

OTHER PUBLICATIONS

Solar Energy Cell—Film Technology; Screen Printing; Apr. 30, 2011; pp. 1-5 and it's English language abstract.

Design of Analog CMOS Integrated Circuits; Feb. 28, 2003; pp. 1-13 and it's English language abstract.

Taiwanese language office action dated Dec. 11, 2013.

English language translation of abstract of TW 201113582 (published Apr. 16, 2011).

English language translation of abstract of TW 201128254 (published Aug. 16, 2011).

* cited by examiner

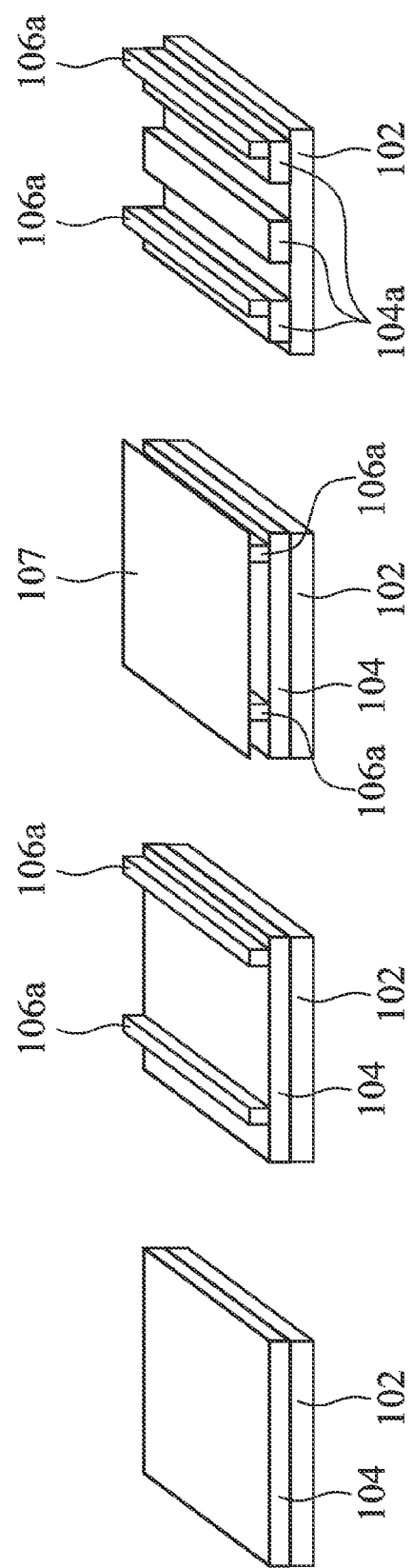

TOUCH PANEL AND METHOD FOR FABRICATING THE SAME AND DISPLAY DEVICE COMPRISING THE SAME

CROSS REFERENCE TO RELATED APPLICATIONS

This Application claims priority of Taiwan Patent Application No. 100129321, filed on Aug. 17, 2011, the entirety of which is incorporated by reference herein.

BACKGROUND OF THE DISCLOSURE

1. Field of the Disclosure

The present disclosure relates to a touch panel, and in particular relates to a touch panel and method for fabricating the same and a display device comprising the same.

2. Description of the Related Art

Consumer electronic applications are becoming increasingly diverse with the rapid progress of science and technology. Many electronic products are light, thin, short and small. Moreover, in various electronic products, touch panels are widely used, such as in portable electronic products (such as personal digital assistant (PDA) or mobile phone).

There are several types of touch panels including resistive, capacitive, surface acoustic wave, and optics touch panels, etc. The capacitive type touch panel comprises a surface capacitive type and a projective capacitive type. The capacitive type touch panel has the advantage of high light transmission, and considerable research attention has been recently focused on development thereof.

FIG. 1 shows a top-view schematic representation of a typical capacitive touch panel 10 of prior art. The capacitive touch panel 10 comprises a border region 2a and a viewing region 2b, wherein the border region 2a is formed at an edge of the viewing region 2b. The viewing region 2b is essentially formed by a patterned transparent conductive layer 14a, such as indium tin oxide (ITO). The patterning process is a known photolithography and etching process. The border region 2a is essentially formed by a trace 16 which is formed by a silver screen printing process. While the manufacturing trend is towards the touch panel to have narrow borders, an overlapping width $d_1$ between the patterned transparent conductive layer 14a and the trace 16 is needed to meet the requirement of below 0.3 mm, and a pitch $d_2$ between the trace 16 and the viewing region 2b is needed to meet the requirement of below 0.5 mm.

Conventionally, the patterned transparent conductive layer 14a is firstly formed and then the trace 16 is formed by a silver screen printing process. However, these fabrication processes must consider the precision of the photolithography process and the silver screen printing process, and also consider the precision of assembling the cover glass and sensitive device (comprising the patterned transparent conductive layer 14a and the trace 16). Thus, a touch panel meeting the above-mentioned $d_1$ and $d_2$ requirements is not easy to fabricate.

Therefore, there is a need to develop a touch panel and method for fabricating the same to improve the precision of processes and production capacity.

SUMMARY OF THE DISCLOSURE

The disclosure provides a touch panel, comprising: a substrate, wherein the substrate comprises a viewing region and a border region at an edge of the viewing region; a patterned transparent conductive layer formed on the substrate, wherein the patterned transparent conductive layer formed on the viewing region has a touch sensitive function; and a patterned metal layer formed on the patterned transparent conductive layer and on the border region, wherein the patterned metal layer comprises a contact region and a trace region connecting to the contact region, and at least a portion of the contact region overlaps with the patterned transparent conductive layer, and a shift range between a formation position of the contact region of the patterned metal layer and a formation position of the patterned transparent conductive layer is smaller than about 150 μm.

The invention also provides a method for fabricating a touch panel, comprising: providing a substrate; forming a transparent conductive layer on the substrate; forming a patterned metal layer on the transparent conductive layer; and patterning the transparent conductive layer to form a patterned transparent conductive layer.

The invention also provides a display device, comprising: a display unit; and a touch panel of the disclosure formed on the display unit.

A detailed description is given in the following embodiments with reference to the accompanying drawings.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2A-2D show schematic representations of various stages of fabricating a touch panel in accordance with an embodiment of the disclosure;

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
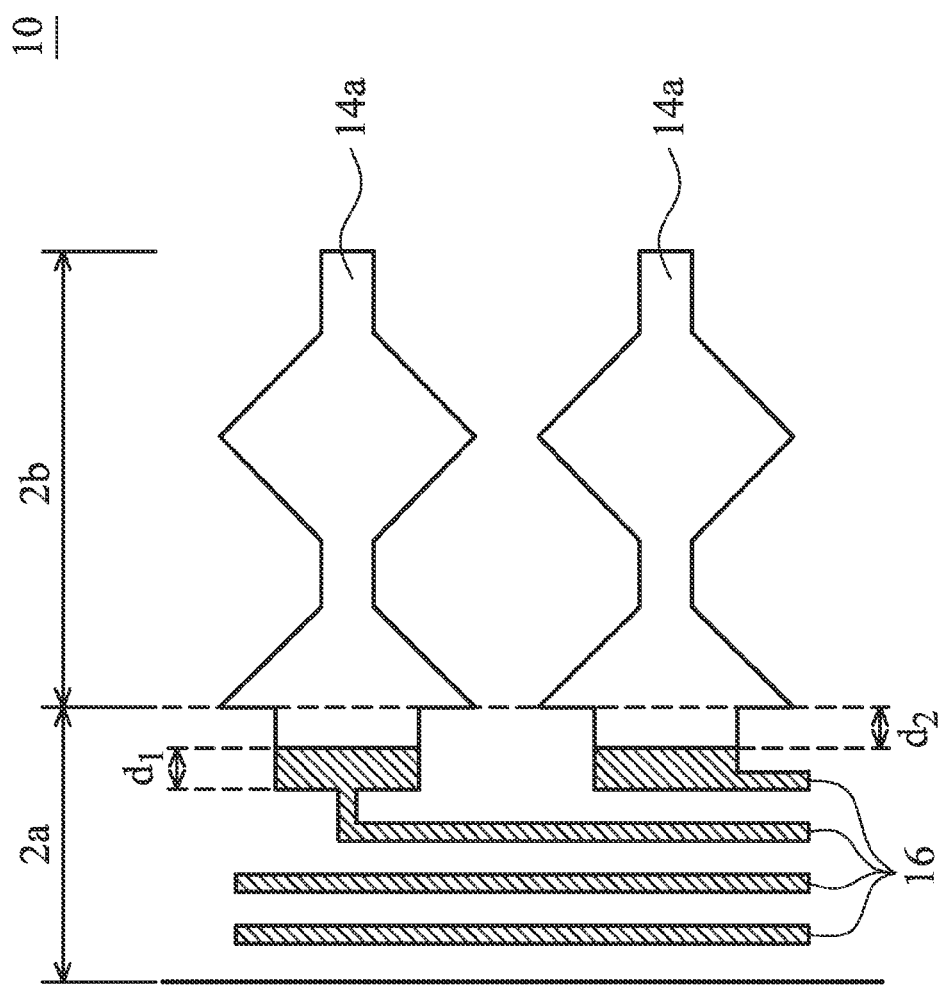
FIG. 1 shows a top-view schematic representation of a typical capacitive touch panel of prior art.

FIGS. 2A-2D show schematic representations of various stages of fabricating a touch panel in accordance with an embodiment of the disclosure. Firstly, referring to FIG. 2A, a substrate 102 is provided. The substrate 102 comprises a viewing region (not shown in FIG. 2A, a position of the viewing region is like the reference number 2b in FIG. 1) and a border region (not shown in FIG. 2A, a position of the border region is like the reference number 2a in FIG. 1) at an edge of the viewing region. The substrate 102 comprises polyethyleneterephthalate (PET), polycarbonate (PC) or polymethylmethacrylate (PMMA). In one embodiment, the substrate 102 is formed by polyethyleneterephthalate (PET).

Then, referring to FIG. 2B, a transparent conductive layer 104 is formed on the substrate 102, wherein the transparent conductive layer 104 formed on the viewing region has a touch sensitive function. Then, a patterned metal layer 106a is formed on the transparent conductive layer 104 and on the border region. The patterned metal layer 106a is formed by a screen printing process.

The transparent conductive layer 104 comprises indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO). The patterned metal layer 106a comprises copper (Cu), nickel (Ni), aluminum (Al), chromium (Cr), silver (Ag) or gold (Au).

In one embodiment, a patterned silver layer is formed on an indium tin oxide (ITO) layer by a silver screen printing process.

Next, referring to FIG. 2C, a photoresist layer 107 is formed on the patterned metal layer 106a.

Referring to FIG. 2D, the transparent conductive layer 104 is patterned by a series of photolithograph and etching process, including coating, exposure, developing, etching and stripping, to form a patterned transparent conductive layer 104a.

In prior art, the patterned metal layer is formed after the patterned transparent conductive layer. Because the precision of the conventional silver screen printing process is about 150 μm (0.15 mm), a shift range of the patterned metal layer of prior art is at least 150 μm (0.15 mm). Compared with prior art, the patterned metal layer is formed before the patterned transparent conductive layer, and thus the first fabrication process is considered as a base line. In other words, the screen printing process having a larger error is considered as the base line. Next, the second fabrication process (photolithography and etching process having a precision of about ±10 μm) is then preceded, and thus only the shift caused by the second fabrication process is needed to be considered. Therefore, the shift of the overall fabrication process of the touch panel is decreased, and the production capacity is improved.

Figure 3B:
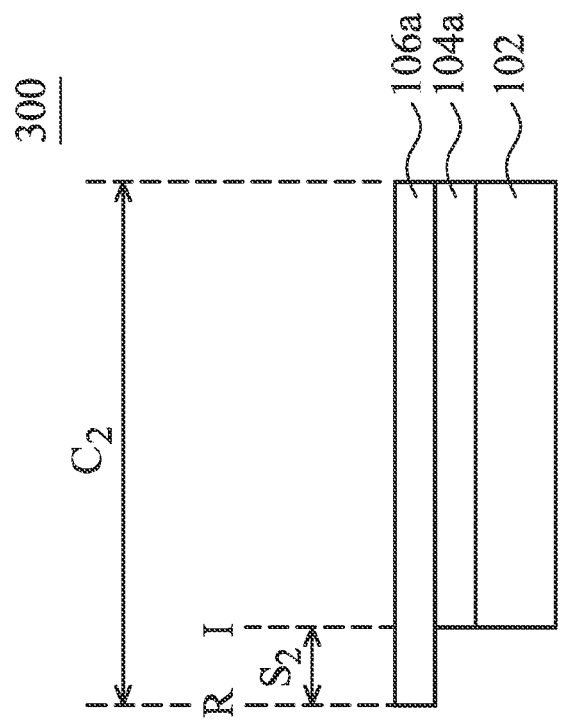
FIGS. 3A-3B show cross-sectional schematic representations of a touch panel in accordance with an embodiment of the disclosure.
Figure 3A:
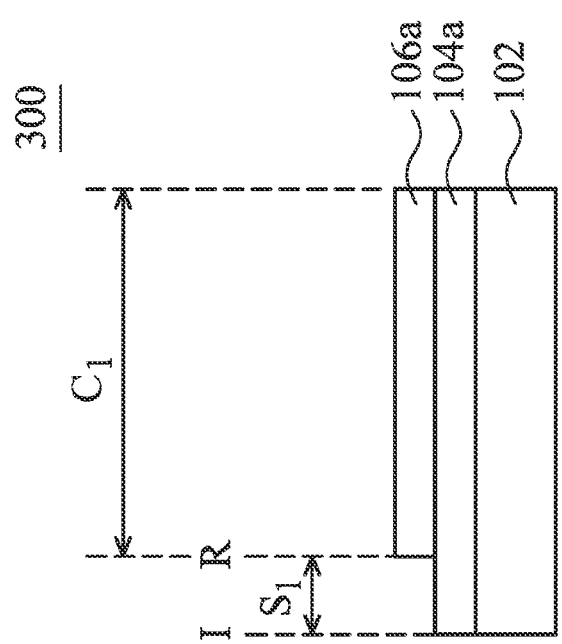

FIG. 3A shows a cross-sectional schematic representation of a touch panel 300 in accordance with an embodiment of the disclosure. The patterned transparent conductive layer 104a is formed on the substrate 102, and the patterned metal layer 106a is formed on the patterned transparent conductive layer 104a. Note that patterned metal layer 106a comprises a contact region $C_1$ and a trace region (not shown in FIG. 3A, the trace region is like the position of the reference number 16 which is not overlapped with the patterned transparent conductive layer 14a in FIG. 1) connecting to the contact region $C_1$, wherein the contact region $C_1$ overlaps the patterned transparent conductive layer 104a. In other words, owing to the shift caused by the fabrication process, only a portion of the patterned transparent conductive layer 104a overlaps the contact region $C_1$. The formation position of the contact region $C_1$ of the patterned metal layer 106a is represented by R and the formation position of the patterned transparent conductive layer 104a is represented by I. As shown in FIG. 3A, the formation position R is shorter than the formation position I, and a shift range between both is $S_1$. By the improvement of the fabrication process of the embodiment of the disclosure, the shift range between the formation position R and the formation position I is smaller than 150 μm, and preferably 10-150 μm. Additionally, a glue and a protective substrate (not shown in FIG. 3) are formed on the patterned metal layer 106a, wherein the glue is formed between the patterned metal layer 106s and the protective substrate to adhere the patterned metal layer 106s to the protective substrate. The glue comprises an optic clear adhesive and the protective substrate comprises a glass plate.

Referring to FIG. 3B, the formation position R of the contact region $C_2$ of the patterned metal layer 106a is longer than the formation position I of the patterned transparent conductive layer 104a, and a shift range between both is $S_2$. By the improvement of the fabrication process of the disclosure, the shift range between the formation position R and the formation position I is smaller than 150 μm, and preferably 10-150 μm. Note that owing to the shift caused by the second fabrication process, only a portion of the patterned metal layer 106a overlaps the patterned transparent conductive layer 104a.

Furthermore, in prior art, a baking process at high temperature is proceeded after the screen printing process to dry a metal paste. The screen printing process and the baking process proceed after formation of the patterned transparent conductive layer, and thus the patterned transparent conductive layer of prior art is baked at a high temperature. During the baking process, several undesirable phenomenons may occur in the patterned transparent conductive layer of prior art, such as the warpage phenomenon, the bluing phenomenon or the obvious scribe line, due to non-uniform volume contraction between each of the patterned transparent conductive layer.

Compared with prior art, the patterned metal layer 106a is formed before patterning the transparent conductive layer 104, and thus the transparent conductive layer 104, not the "patterned" transparent conductive layer 104a, is baked by the baking process at a high temperature. Because the transparent conductive layer 104 is not patterned, the volume contraction of the transparent conductive layer 104 is uniform, and the undesirable phenomenons (the warpage phenomenon, the bluing phenomenon or the obvious scribe line) may not occur.

Figure 4:
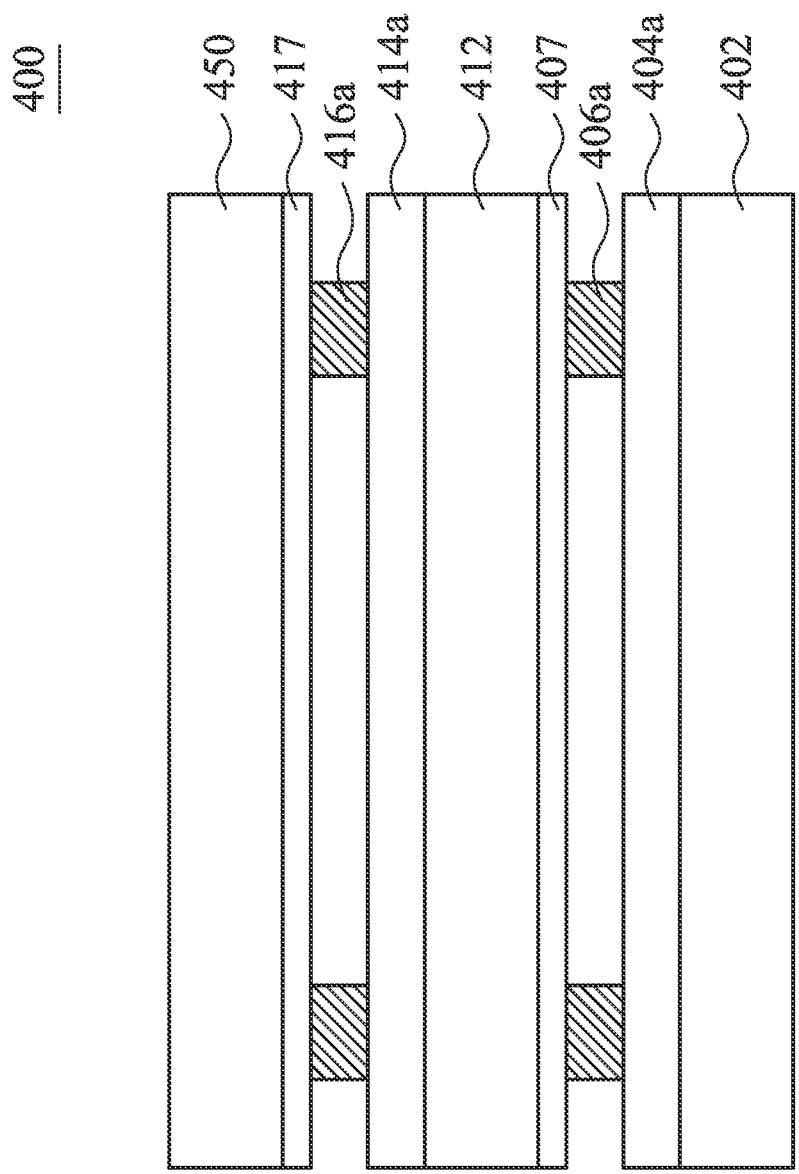
FIG. 4 show a cross-sectional schematic representation of a touch panel in accordance with another embodiment of the disclosure.

Additionally, FIG. 4 shows a cross-sectional schematic representation of a touch panel 400 in accordance with another embodiment the disclosure. A first patterned transparent conductive layer 404a, a first patterned metal layer 406a, a first glue 407, a second substrate 412, a second patterned transparent conductive layer 414a, a second patterned metal layer 416a, a second glue 417 and a protective substrate 450 are sequentially formed on a first substrate 402. The first glue 407 and second glue 417 independently comprise an optic clear adhesive. The first patterned transparent conductive layer 404a and the second patterned transparent conductive layer 414a respectively represent X-axis capacitive sensor layer and Y-axis capacitive sensor layer.

Note that a shift range between a formation position of a contact region of the first patterned metal layer 406a and a formation position of the first patterned transparent conductive layer 404a is smaller than 150 μm, and preferably 10-150 μm. A shift range between a formation position of a contact region of the second patterned metal layer 416a and a formation position of the second patterned transparent conductive layer 414a is smaller than 150 μm, and preferably 10-150 μm.

Figure 5:
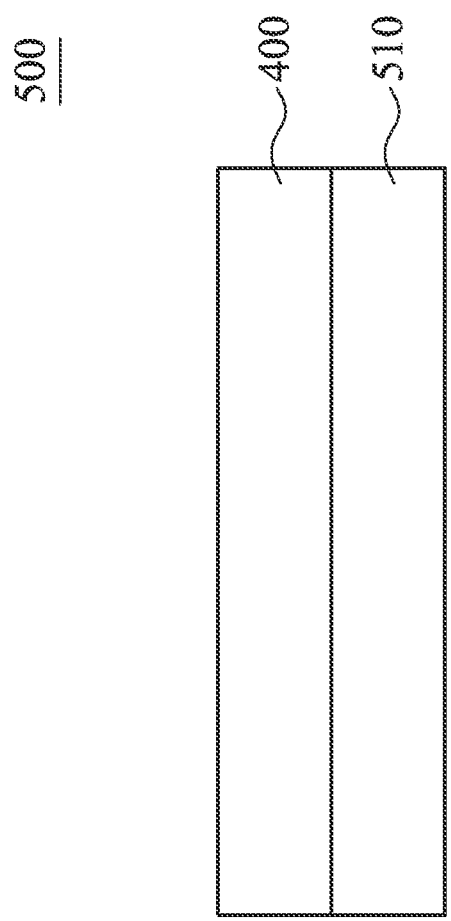
FIG. 5 shows a cross-sectional schematic representation of a display device in accordance with an embodiment of the disclosure.

Moreover, referring to FIG. 5, the disclosure also provides a display device 500, which comprises a display unit 510 and a touch panel 400 formed on the display unit 510. Note that the touch panel 400 is formed by the fabrication process of the disclosure. The display unit 510 comprises a liquid crystal display (LCD) or an organic light emitting diode (OLED).

From the above discussion, the disclosure provides a touch panel and method for fabricating the same. The method comprises forming the patterned metal layer before forming the patterned transparent conductive layer. Thus, the shift range between the formation position of the contact region of the patterned metal layer and the formation position of the patterned transparent conductive layer is smaller than 150 μm. Therefore, by changing the order of the fabrication process, the touch panel of the disclosure meets the requirement of having a narrow border. Additionally, the transparent conductive layer 104, not the "patterned" transparent conductive layer 104a, is baked by the baking process. Thus, the volume contraction of the transparent conductive layer 104 is uniform, and the undesirable phenomenons (the warpage phenomenon, the bluing phenomenon or the obvious scribe line) may not occur.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch panel, comprising:
   a substrate, wherein the substrate comprises a viewing region and a border region at an edge of the viewing region;
   a patterned transparent conductive layer formed on the substrate, wherein the patterned transparent conductive layer formed on the viewing region has a touch sensitive function; and
   a patterned metal layer formed on the patterned transparent conductive layer and on the border region, wherein the patterned metal layer comprises a contact region and a trace region connecting to the contact region, and at least a portion of the contact region overlaps with the patterned transparent conductive layer, and a shift range between a formation position of the contact region of the patterned metal layer and a formation position of the patterned transparent conductive layer is smaller than about 150 m.

2. The touch panel as claimed in claim 1, wherein the shift range between the formation position of the contact region of the patterned metal layer and the formation position of the patterned transparent conductive layer is about 10-150 m.

3. The touch panel as claimed in claim 1, wherein the substrate comprises polyethyleneterephthalate (PET), polycarbonate (PC) or polymethylmethacrylate (PMMA).

4. The touch panel as claimed in claim 1, wherein the patterned transparent conductive layer comprises indium tin oxide (ITO), indium zinc oxide (IZO), cadmium tin oxide (CTO), aluminum zinc oxide (AZO), indium tin zinc oxide (ITZO) zinc oxide, cadmium oxide (CdO), hafnium oxide (HfO), indium gallium zinc oxide (InGaZnO), indium gallium zinc magnesium oxide (InGaZnMgO), indium gallium magnesium oxide (InGaMgO) or indium gallium aluminum oxide (InGaAlO).

5. The touch panel as claimed in claim 1, wherein the patterned metal layer comprises copper (Cu), nickel (Ni), aluminum (Al), chromium (Cr), silver (Ag) or gold (Au).

6. The touch panel as claimed in claim 1, further comprising:
   a protective substrate formed on the patterned metal layer; and
   a glue formed between the patterned metal layer and the protective substrate to adhere the patterned metal layer to the protective substrate.

7. The touch panel as claimed in claim 6, wherein the glue comprises an optic clear adhesive and the protective substrate comprises a glass plate.

8. The touch panel as claimed in claim 1, further comprising:
   a first glue formed on the patterned metal layer;
   a second substrate formed on the first glue;
   a second patterned transparent conductive layer formed on the second substrate;
   a second patterned metal layer formed on an edge of the second patterned transparent conductive layer, wherein the second patterned metal layer comprises a second contact region and a second trace region connecting to the second contact region, and at least a portion of the second contact region overlaps with the second patterned transparent conductive layer, and a shift range between a formation position of the second contact region of the second patterned metal layer and a formation position of the second patterned transparent conductive layer is smaller than about 150 m;
   a second glue formed on the second patterned metal layer; and
   a protective substrate formed on the second glue.

9. A method for fabricating a touch panel, comprising:
   providing a substrate;
   forming a transparent conductive layer on the substrate;
   forming a patterned metal layer on an edge of the transparent conductive layer;
   patterning the transparent conductive layer to form a patterned transparent conductive layer; and
   defining a contact region and a trace region connecting to the contact region from the patterned metal layer, wherein at least a portion of the contact region overlaps with the patterned transparent conductive layer, and a shift range between a formation position of the contact region of the patterned metal layer and a formation position of the patterned transparent conductive layer is smaller than about 150 μm.

10. The method for fabricating a touch panel as claimed in claim 9, wherein the substrate comprises a viewing region and a border region at an edge of the viewing region, and the patterned transparent conductive layer formed on the viewing region has a touch sensitive function, and the patterned metal layer is formed on the border region.

11. The method for fabricating a touch panel as claimed in claim 9, wherein the patterned metal layer is formed on the edge of the transparent conductive layer by a screen printing process.

12. The method for fabricating a touch panel as claimed in claim 9, wherein the patterned transparent conductive layer is formed by a photolithograph and etching process.

13. The method for fabricating a touch panel as claimed in claim 9, wherein the shift range between the formation position of the contact region of the patterned metal layer and the formation position of the patterned transparent conductive layer is about 10-150 μm.

14. A display device, comprising:
   a display unit; and
   a touch panel as claimed in claim 1, formed on the display unit.

15. The display device as claimed in claim 14, wherein the display unit comprises a liquid crystal display (LCD) or an organic light emitting diode (OLED).

* * * * *